United States Patent [19]
Ishida

[11] Patent Number: 5,588,483
[45] Date of Patent: Dec. 31, 1996

[54] HEAT RADIATING APPARATUS

[75] Inventor: Yoshio Ishida, Osaka, Japan

[73] Assignee: Diamond Electric Mfg. Co., Ltd., Osaka, Japan

[21] Appl. No.: 590,083

[22] Filed: Jan. 26, 1996

[30]  Foreign Application Priority Data

Jan. 27, 1995  [JP]  Japan .................................. 7-031579

[51] Int. Cl.$^6$ ................................................ F28D 11/00
[52] U.S. Cl. .................. 165/86; 165/104.33; 165/134.1;
165/185; 361/687; 361/700
[58] Field of Search ................................. 361/711, 706,
361/705, 700, 687; 165/134.1, 104.33,
104.26, 185, 86, DIG. 138, DIG. 135; 257/715,
714, 713; 62/259.2

[56]  References Cited

U.S. PATENT DOCUMENTS

| 4,998,584 | 3/1991 | Foglesonger et al. | 165/134.1 X |
|---|---|---|---|
| 5,313,362 | 5/1994 | Hatada et al. | 361/687 X |
| 5,383,340 | 1/1995 | Larson et al. | 361/700 X |
| 5,513,070 | 4/1996 | Xie et al. | 361/700 |

FOREIGN PATENT DOCUMENTS

| 0102653 | 8/1979 | Japan | 165/86 |
|---|---|---|---|
| 4048693 | 2/1992 | Japan | 361/687 |

OTHER PUBLICATIONS

IBM Corp., Water–Enhanced Selective Module Cooling For Air–Cooled Circuit Cards, Jun. 1985, pp. 110–112.

Baran, Liquid–Cooled PCs: The Next Hot Thing?, Feb. 1994, p. 32.

*Primary Examiner*—John Rivell
*Assistant Examiner*—Christopher Atkinson
*Attorney, Agent, or Firm*—Longacre & White

[57]  ABSTRACT

A heat radiating apparatus includes a metal pipe attached to at least one side of a metal plate, a heat pipe inserted into an internal hollow of the metal pipe, the hollow being filled with grease having high thermal conductivity, a sleeve seal provided at least one longitudinal end of the metal pipe for sealing the grease in such a way as to permit the heat pipe to freely rotate, and a heat receiving section through which a part of the heat pipe is in contact with a heating body.

7 Claims, 3 Drawing Sheets

120 TO HEAT RECEIVING PLATE

HEAT RADIATING APPARATUS

BACKGROUND OF THE INVENTION

This invention relates to a heat radiating apparatus for use in electric and electronic equipment and, more particularly, to a heat radiating apparatus which uses a heat pipe connected to a heat radiating plate and a heat receiving plate via a medium for heat transfer purposes.

On one hand the function of information equipment represented by computers such as personal computers or workstations is improved, on the other hand much smaller and lightweight information equipment is desired. For example, laptop computers which were once-dominant conventional portable computers have transformed into much smaller notebook computers.

The content volume of the housing of the conventional laptop computer is about 15 litters, whereas that of the notebook computer is solely about 5 litters. In view of this fact, the solution of a problem of heat developed inside the computer as well as the size reduction of the computer system have become important.

In general, the notebook computer has an outer dimension as large as A4 size and a thickness of about 6 cm. The computer is comprised of the main unit including a keyboard and a liquid crystal display having a cover structure for covering the upper surface of the main unit. The hinged liquid crystal display can be freely opened or closed with respect to the main unit. On the assumption that the total power consumption of this notebook computer is 25 watts, the main unit consumes about 15 watts, that is, about 60% of the total power, and the liquid crystal display consumes about 10 watts, that is, the remaining 40% of the power.

To radiate heat developing in a semiconductor device such as an computing element in the main unit, a variety of heat sinks or heat radiating materials or apparatuses such as a microheat pump are used in the above mentioned notebook computer. Particularly, most of the heat pipes are comprised of the main body incorporating a heat receiving plate and a heat radiating plate inside or the main body having only a heat radiating plate disposed at a part of the main body so as to be exposed to outside air. The majority of the heat pipes of this type are provided with heat radiating means which is disposed on the bottom surface of the main body.

In the previously mentioned notebook computer, the heat developed resulting from the consumption of a power of 10 watts in the liquid crystal display is radiated from the front and rear surfaces of the liquid crystal display which are directly exposed to the outside air and hence enable relatively effective heat radiation. Contrary to this, the heat developed resulting from the consumption of a power of 15 watts in the main unit is chiefly radiated only from the bottom surface of the main unit. For this reason, there is a limit to the effective radiation of heat, which results in an insufficient heat radiation effect. Further, the bottom surface of the main unit remains in contact with the surface of the desk while the computer is in use. Since the keyboard is placed on top of this main unit, the heat radiated from the main unit may makes fingers or the palms of the hands sweaty, which in turn becomes cause of user discomfort.

When heat is radiated using a conventional heat pipe, the heat pipe does not have a defined outer shape. Unless the heat pipe is large, it will be difficult to improve the heat radiation effect. This hinders the miniaturization of the main unit of the notebook computer.

SUMMARY OF THE INVENTION

This invention is as its object to solve the above mentioned drawbacks in the prior art by providing means for transferring heat developed in the main unit to a liquid crystal display without modification of layout of a heat source such as electronic components.

The previously mentioned problems are solved by a heat radiating apparatus, according to one aspect of the present invention, comprising: a metal pipe 225 attached to at least one side of a metal plate 222; a heat pipe 100 inserted into an internal hollow 226 of the metal pipe 225; the hollow 226 being filled with grease 224 having high thermal conductivity; a sleeve seal 223 provided at least one longitudinal end of the metal pipe 225 for sealing the grease 224 in such a way as to permit the heat pipe 100 to freely rotate; and a heat receiving plate 110 through which a part of the heat pipe 100 is in contact with a heating body 211. The metal pipe 225 may be formed by rounding the edge of the metal plate 222. The respective cross sections of the metal pipe 225 and the heat pipe 100 may be made circular, and the diameter of the hollow 226 filled with the grease 224 may be set to 0.05 to 0.7 mm. The heat pipe 100 may be subjected to surface treatment using either nickel or chrome or both of them. The sleeve seal 223 may be formed from alloys of copper, and the grease 224 may be formed by mixing carbon powders or metal oxide powders into silicon.

Further, according to another aspect of the present invention, a heat radiating apparatus for use in information equipment which includes a main unit 210 and a liquid crystal display 220 connected to the main unit 210 by means of hinge mechanism sections 262, the heat radiating apparatus comprising: a metal pipe 225 disposed along the center axis of the hinge mechanism sections 262 of the liquid crystal display 220; a metal plate 222 continuously extending from the metal pipe 225 in such a way to occupy at least a part of the rear surface of the liquid crystal display 220; a heat pipe 100 inserted into an internal hollow 226 of the metal pipe 225; at least one center fixture 230 which is attached to a linear portion of the heat pipe 100 inserted into the hollow 226 so as to be aligned with the center of the hinge mechanisms 262 of the main unit 210; a heating element 211 of the main unit 210 connected to at least one L-shaped end of the heat pipe 100; grease 224 having high thermal conductivity provided in the hollow 226 between the metal pipe 225 and the heat pipe 100; and a sleeve seal 223 for sealing the grease 224 provided at least one end of the metal pipe 225 so as to permit the rotation of the metal pipe 225.

The heat radiating apparatus having the above construction allows heat generated by the heat generating element 211 to diffuse from a container 120 of the heat pipe 100 into the metal plate 222 via the grease 224 and the metal pipe 225. The metal pipe 225 which acts as the heat radiating portion can be made long, which makes it possible to reduce heat resistance to a considerably small value. Since the metal pipe 225 is a part of the metal plate 222, the heat transmitted through the metal pipe 225 can be radiated from the overall surface of the metal plate 222. As previously mentioned, the grease 224 is provided between the heat pipe 100 and the metal pipe 225, and therefore the metal plate 22 can be opened and closed without an excessive force being exerted on the heat pipe 100 even when the liquid crystal display 220 is opened and closed.

DETAILED DESCRIPTION OF THE PREFERRED EMBODIMENTS

Figure 1:
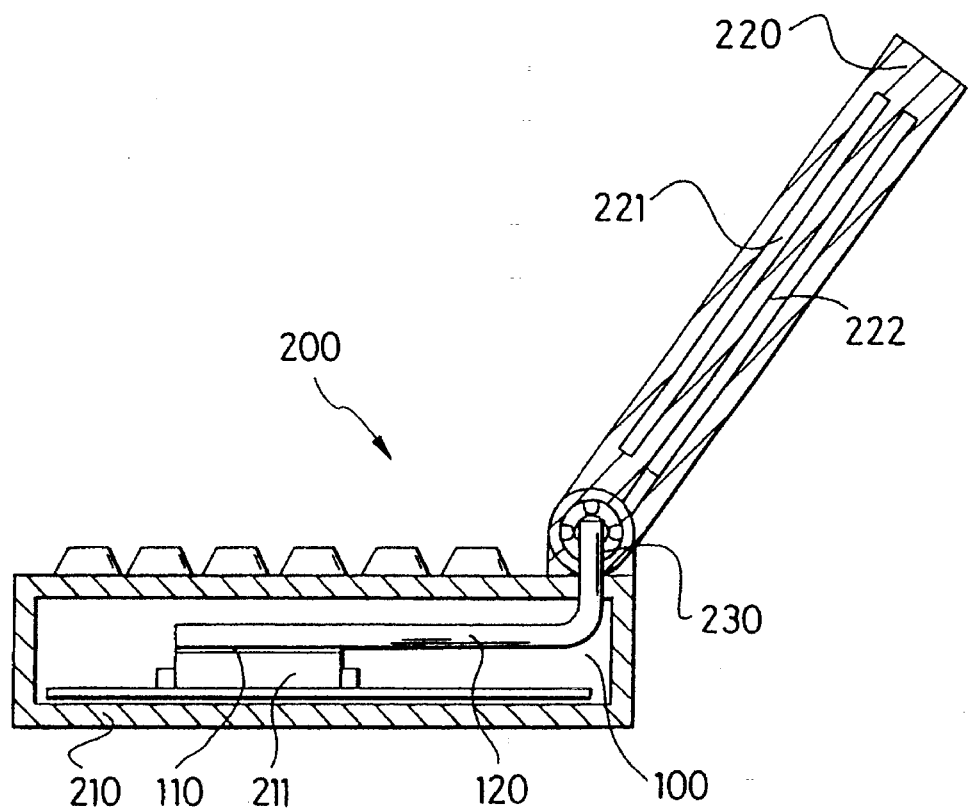
FIG. 1 is a side cross section of a notebook computer according to one embodiment of the present invention.

FIG. 1 is a side cross section of a notebook computer provided with a heat pipe according to an embodiment of the present invention. In FIG. 1, a notebook computer 200 is made up of a main unit 210 including a keyboard, and a liquid crystal display 220 with a cover construction. The main unit 210 and the liquid crystal display 220 are connected together via hinge-like connectors. A heating element 211 such as a CPU and an arithmetic element is disposed in the main unit 210. The liquid crystal display 220, serving as a cover for covering the upper surface of the main unit, is provided with a liquid crystal plate 221 and a metal plate 22 for shielding the liquid crystal plate 221 from undesired radio waves or light. A heat receiving plate 110 is placed on top of the heating element 211, and this heat receiving plate 110 and the metal plate 222 are connected together through a container 120 of the heat pipe 100. The heat receiving plate 110 is formed from material having superior thermal conductivity such as aluminum or copper in such a way that an internal space is formed in the heat receiving plate 110. The container 120 is cylindrical and has an internal hollow. A wick (not shown) is provided in this hollow, and the hollow is hermetically filled with a hydraulic fluid, thereby forming a heat pipe 100. The heat receiving plate 110 provided at one end of the container 120 is jointed to the heat pipe 100 by caulking or brazing. The heating element 211 and the heat receiving plate 110 are bonded to each other by pressure welding or a known fixing structure such as a pressure sensitive adhesive double coated tape. Moreover, the other end of the container 120 is connected to the metal plate 222 in a manner which will be described below.

Figure 2:
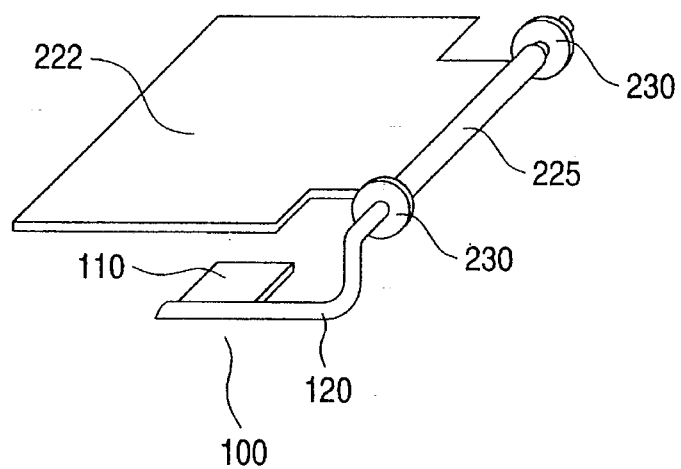
FIG. 2 is a partial perspective view of surrounding areas of a metal plate and a heat pipe.

FIG. 2 is a perspective view of one example of the connection between the heat pipe 100 and the metal plate 222. In FIG. 2, one edge of the metal plate 222 is formed into a cylindrical pipe 225, and the heat pipe 100 is disposed in this cylindrical pipe 225. The opposite end of the container 120 to its end connected to the heat receiving plate 110 is inserted into an internal hollow 226 in the metal pipe 225. The container 120 is inserted into the internal hollow 226 partway or through to the other end of the hollow 226.

Figure 3:
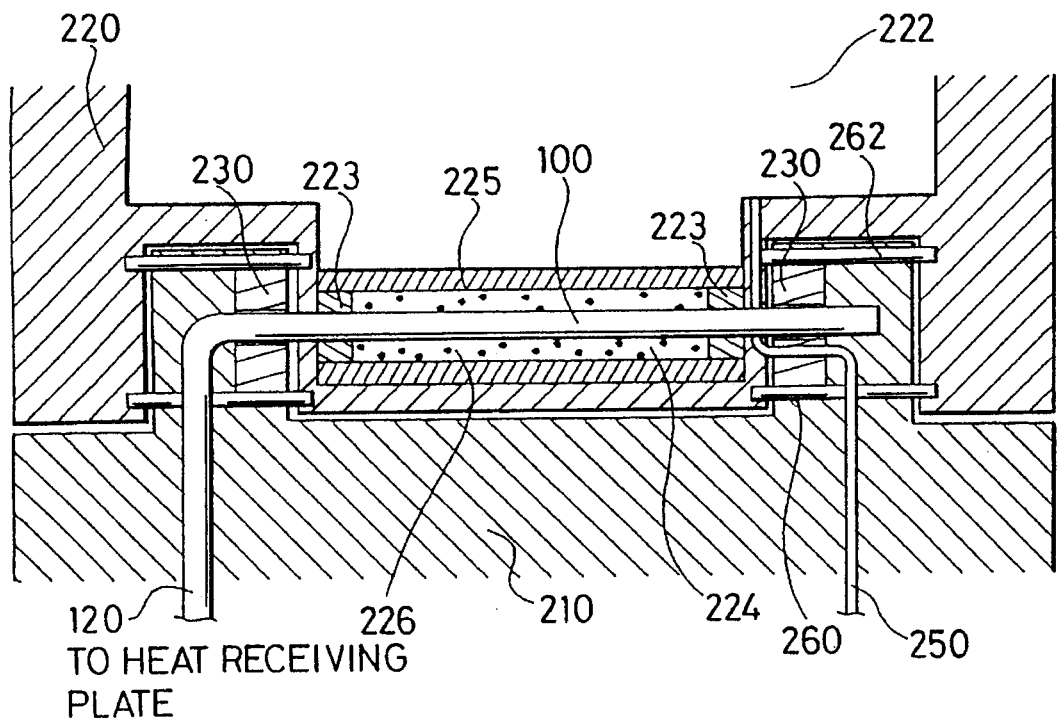
FIG. 3 is a cross section of a joint between the main unit and a liquid crystal display.

FIG. 3 is an enlarged cross section showing the metal pipe 225 and the container 120. In FIG. 3, the hollow 226 of the metal pipe 225 is filled with the grease 224 having superior thermal conductivity such as silicon or ethyleneglycol. A sleeve seal 223—223 is provided at least at one longitudinal end of the hollow 226 of the metal pipe 225 so as to prevent the grease 224 from leaking out of the hollow 226. A hole is formed in the sleeve seal 223 provided at least one longitudinal end of the hollow 226 so as to permit the container 120 to pass through the sleeve seal 223. As a result, the container 120 passes through the internal hollow 226 of the metal pipe 225 from the sleeve seal 223 provided at one end of the hollow 226 to the sleeve seal 223 provided at the other end of the same, or the container 120 enters the internal hollow 226 of the metal pipe 225 from the sleeve seal 223 provided at one end of the hollow 226. In FIGS. 1, 2, and 3, a center fixture 230 is provided in the vicinity of at least one end of the metal pipe 225. As shown in FIG. 3, the main unit 210 and the liquid crystal display 220 are integrated together by means of hinge mechanisms 262.

Figure 4:
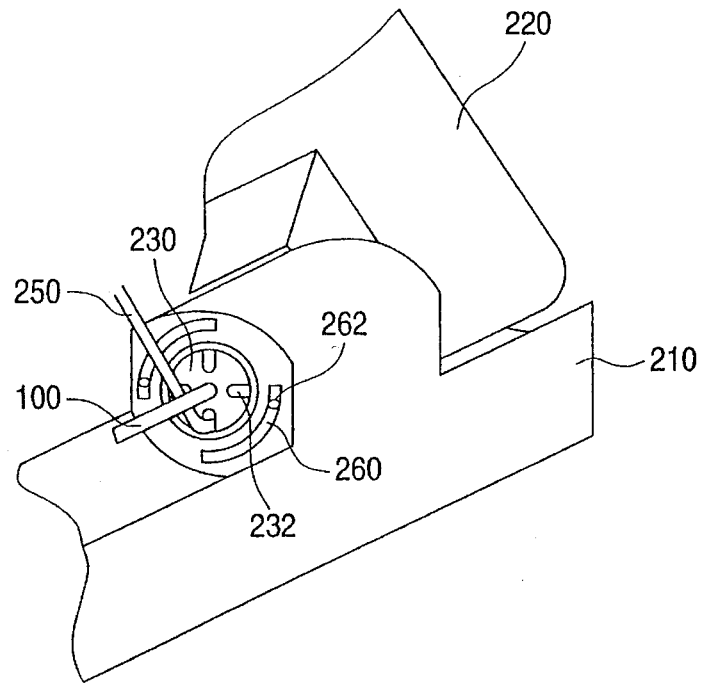
FIG. 4 is an enlarged perspective view showing a hinge portion of the main unit.
Figure 5:
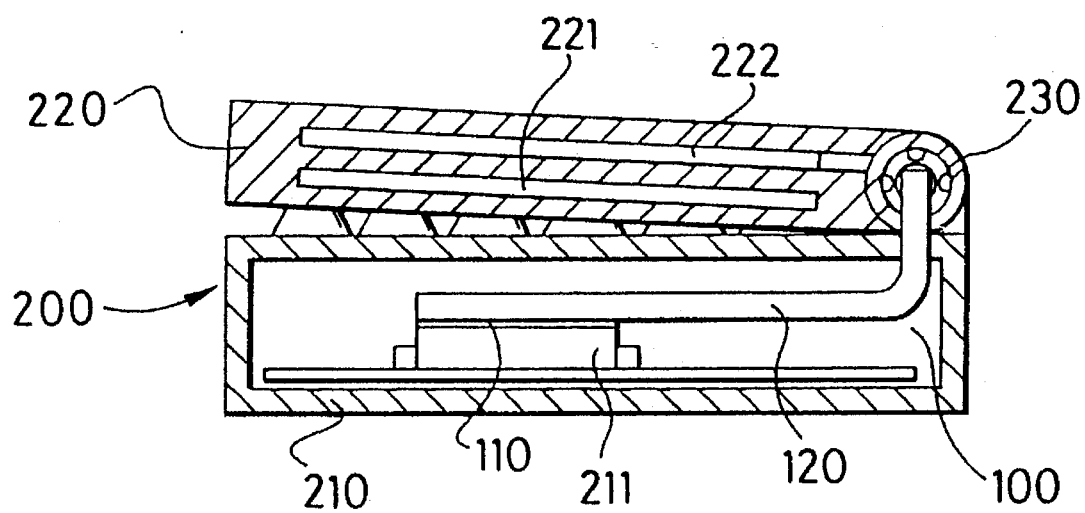
FIG. 5 is a side cross section of a notebook computer when its liquid crystal display is closed.

FIG. 4 is a perspective cross section of the center fixture 230 and the hinge mechanism 262. As shown in FIG. 4, the center fixtures 230 are embedded in the respective hinge portions of the main unit 210 that permit the folding action of the liquid crystal display 220. Hinge mechanism slots 260 are formed along the outer circumference of each of the center fixture 230. At least one wiring aperture 232 is formed in the center fixture 230 so as to extend from the outer circumference to the center of the fixture 230. All or a part of electrical wiring 250 is provided between the main unit 210 and the liquid crystal display 220 through the wiring aperture 232. As previously mentioned, the liquid crystal display 220 and the main unit 210 are integrated together by means of the hinge mechanism 262. As a result of the movement of the hinge mechanism 262 along the hinge mechanism slot 260, the liquid crystal display 220 is opened and closed. For example, when the liquid crystal display 220 is closed as it is shown in FIG. 5, the center fixtures 230 are fixedly embedded in the respective hinge portions of the main unit 210, and therefore the wiring 250 does not undergo an excessive force.

In the above embodiment, if a part or the whole of the heat receiving plate 110 is formed into a fin-shaped crimped plate, the heat collecting effect is improved. Further, in the above embodiment, if the diameter of the hollow 226 is set to 0.05 to 0.7 mm, it will be possible to reduce the size of the heat developing apparatus as well as to improve the heat radiating property and mechanical durability. Furthermore, if the heat pipe 100 is subjected to surface treatment using either nickel or chrome or both of them, if the sleeve seal 223 is made of alloys of copper, and if the grease 224 is made by mixing carbon powders or metal oxide powders into silicon, the durability and heat radiating characteristics of the heat pipe will be effectively improved.

As a result of the use of the heat pipe having the above construction, an effective heat radiating effect is obtained without changing the shapes of housings of the main unit and the liquid crystal display and the layout of constituents of the conventional information equipment such as notebook computers. In short, a heat radiating effect is obtained by utilization of the construction and shape of the conventional equipment without modifications, and hence it becomes unnecessary to considerably change the design of the information equipment.

What is claimed is:

1. A heat radiating apparatus comprising:

a metal pipe attached to at least one side of a metal plate;

a heat pipe inserted into an internal hollow of said metal pipe, the hollow being filled with grease having high thermal conductivity;

a sleeve seal provided at least one longitudinal end of said metal pipe for sealing the grease in such a way as to permit said heat pipe to freely rotate; and a heat receiving section through which a part of said heat pipe is in contact with a heating body.

2. The heat radiating apparatus of claim 1, wherein said metal pipe is formed by rounding the edge of said metal plate.

3. The heat radiating apparatus of claim 1, wherein the respective cross sections of said metal pipe and said heat pipe are circular, and the diameter of the hollow is set to 0.05 to 0.7 mm.

4. The heat radiating apparatus of claim 1, wherein said heat pipe is subjected to surface treatment with a material selected from a group of at least nickel, chrome.

5. The heat radiating apparatus of claim 1, wherein said sleeve seal is made from alloys of copper.

6. The heat radiating apparatus of claim 1, wherein the grease is made by mixing materials selected from a group of a carbon powder, and a metal oxide powder into silicon.

7. A heat radiating apparatus for use in information equipment which includes a main unit and a liquid crystal display connected to said main unit by means of hinge mechanism sections, said heat radiating apparatus comprising:

a metal pipe disposed along the center axis of said hinge mechanism sections of said liquid crystal display;

a metal plate continuously extending from said metal pipe in such a way as to occupy at least a part of the rear surface of said liquid crystal display;

a heat pipe inserted into an internal hollow of said metal pipe;

at least one center fixture which is attached to a linear portion of said heat pipe inserted into the hollow so as to be aligned with the center of the hinge mechanisms of said main unit;

a heating element of said main unit connected to at least one L-shaped end of said heat pipe;

grease having high thermal conductivity provided in the hollow between said metal pipe and said heat pipe; and a sleeve seal for sealing the grease provided at least one end of said metal pipe so as to permit the rotation of said metal pipe.

* * * * *